(12) United States Patent
Lozhkin

(10) Patent No.: US 9,397,619 B2
(45) Date of Patent: Jul. 19, 2016

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 85 days.

(21) Appl. No.: 14/490,200

(22) Filed: Sep. 18, 2014

(65) Prior Publication Data

US 2015/0214904 A1    Jul. 30, 2015

(30) Foreign Application Priority Data

Jan. 30, 2014  (JP) ................................. 2014-015581

(51) Int. Cl.
| | |
|---|---|
| *H03F 1/26* | (2006.01) |
| *H03F 1/32* | (2006.01) |
| *H03F 3/19* | (2006.01) |
| *H03F 3/24* | (2006.01) |

(52) U.S. Cl.
CPC ............ *H03F 1/3247* (2013.01); *H03F 1/3258* (2013.01); *H03F 3/19* (2013.01); *H03F 3/245* (2013.01); *H03F 2200/102* (2013.01); *H03F 2200/451* (2013.01); *H03F 2201/3227* (2013.01)

(58) Field of Classification Search
USPC .......................................... 330/149, 109, 85
IPC ....................................................... H03F 1/26
See application file for complete search history.

(56) References Cited

U.S. PATENT DOCUMENTS

| | | | | |
|---|---|---|---|---|
| 2003/0228856 | A1* | 12/2003 | Orihashi | ............... H03F 1/3247 455/226.1 |
| 2009/0115513 | A1* | 5/2009 | Hongo | .................. H03F 1/3247 330/149 |
| 2011/0163806 | A1* | 7/2011 | Hongo | .................. H03F 1/3247 330/149 |
| 2014/0167844 | A1* | 6/2014 | Utsunomiya | ......... H03F 1/3247 330/149 |

FOREIGN PATENT DOCUMENTS

| | | |
|---|---|---|
| JP | 2001-127819 | 5/2001 |
| JP | 2002-290166 | 10/2002 |
| JP | 2006-140785 | 6/2006 |
| JP | 2006-352852 | 12/2006 |
| JP | 2013-106330 | 5/2013 |

OTHER PUBLICATIONS

Hsin-Hung Chen et al., "Joint Polynomial and Look-Up-Table Predistortion Power Amplifier Linearization", IEEE Transactions on Circuits and Systems—II: Express Briefs, vol. 53, No. 8, Aug. 2006, pp. 612-616 (5 pages).

Yuelin Ma et al., "An Open-Loop Digital Predistorter Based on Memory Polynomial Inverses for Linearization of RF Power Amplifier", International Journal of RF and Microwave Computer-Aided Engineering, vol. 21 No. 5, Sep. 2011, pp. 589-595 (7 pages).

* cited by examiner

*Primary Examiner* — Patricia T Nguyen
(74) *Attorney, Agent, or Firm* — Fujitsu Patent Center

(57) ABSTRACT

A predistorter gives an input signal inputted to a power amplifier distortion corresponding to a compensation coefficient. A band limiter limits components in a second frequency band other than a first frequency band of a feedback signal fed back from the power amplifier, and distorts components in the first frequency band according to the limited components in the second frequency band. A learner updates the compensation coefficient on the basis of the distorted feedback signal.

5 Claims, 12 Drawing Sheets

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2014-015581, filed on Jan. 30, 2014, the entire contents of which are incorporated herein by reference.

FIELD

The embodiments discussed herein are related to a distortion compensation apparatus and a distortion compensation method.

BACKGROUND

A power amplifier for amplifying a transmitted signal is used in a radio transmitter which transmits a radio signal in a radio communication system. A power amplifier has a linear characteristic in a region in which the amplitude of an input signal is small. That is to say, there is an approximately linear relationship between the amplitude of an input signal and the amplitude of an output signal. On the other hand, a power amplifier has a nonlinear characteristic in a region in which the amplitude of an input signal is large. That is to say, there is a nonlinear relationship between the amplitude of an input signal and the amplitude of an output signal. In many cases, a power amplifier is made to operate not only in the linear region but also in the nonlinear region in order to efficiently utilize a power amplifier.

For example, however, nonlinear distortion of a transmitted signal due to the nonlinear amplification characteristic of a power amplifier may cause power leakage from a desired frequency band to an adjacent frequency band. As a result, radio communication quality deteriorates. Accordingly, a radio transmitter may perform predistortion-type distortion compensation as one of methods for linearizing the nonlinear amplification characteristic of a power amplifier. With the predistortion-type distortion compensation a radio transmitter includes a predistorter as a linearizer.

The predistorter gives an input signal inputted to a power amplifier nonlinear distortion reverse to the nonlinear characteristic of the power amplifier. For example, the predistorter gives each input signal gain according to its level. By passing an input signal to which nonlinear distortion reverse to the nonlinear characteristic of the power amplifier is given through the power amplifier, nonlinear distortion of an amplified transmitted signal is controlled. However, it is not easy to correctly estimate in advance a characteristic reverse to the nonlinear characteristic of a power amplifier. Therefore, the method of learning (updating) a compensation coefficient used by a predistorter while operating a power amplifier may be adopted.

A polynomial method or a LUT (Lookup Table) method is proposed as a method implemented in a predistorter. With the polynomial method a characteristic reverse to the nonlinear characteristic of a power amplifier is represented as a polynomial including a variable indicative of the level of an input signal and a plurality of coefficients. With the LUT method a characteristic reverse to the nonlinear characteristic of a power amplifier is represented as a table in which the level of an input signal is associated with gain given thereto.

A direct learning method, an indirect learning method, or a model inversion method is proposed as a method for learning a compensation coefficient to be used by a predistorter. With the direct learning method, a comparison is made between a feedback signal from a power amplifier and an input signal before distortion compensation and a compensation coefficient is updated so that an error between them will become smaller. With the indirect learning method, a training distorter for applying a compensation coefficient to a feedback signal from a power amplifier is used and the compensation coefficient is updated so that an error between an input signal after distortion compensation and an output from the training distorter will become smaller. A compensation coefficient learned by the training distorter is copied to a predistorter. With the model inversion method, a modeler for applying a model of a power amplifier to an input signal after distortion compensation is used and the model is updated so that an error between a feedback signal from the power amplifier and an output from the modeler will become smaller. A compensation coefficient indicative of a characteristic (inverse model) reverse to the nonlinear characteristic of a model learned by the modeler is then calculated and is set in a predistorter.

By the way, various signal processing units, such as an ADC (Analog to Digital Converter), may be used on a feedback path along which a feedback signal is obtained from a power amplifier. A great bandwidth of a feedback signal which passes along the feedback path may have disadvantages. For example, a load at the time of compensation coefficient learning is heavy or the costs are high because of the use of high performance signal processing units. Accordingly, a linearizer including an LPF (Low Pass Filter) on a feedback path is proposed. This linearizer removes high-frequency components by the use of the LPF. By doing so, the linearizer limits a bandwidth of a feedback signal, compared with a transmitted signal outputted from a power amplifier. As a result, the linearizer learns a compensation coefficient indicative of a characteristic reverse to the nonlinear characteristic of the power amplifier on the basis of the feedback signal whose bandwidth is limited.

Japanese Laid-open Patent Publication No. 2013-106330

Hsin-Hung Chen, Chih-Hung Lin, Po-Chiun Huang and Tsair Chen, "Joint Polynomial and Look-Up-Table Predistortion Power Amplifier Linearization", IEEE (Institute of Electrical and Electronics Engineers) Transactions on Circuits and Systems-II: Express Briefs, Vol. 53 No. 8, pp. 612-616, August 2006

Yuelin Ma, Songbai He, Yoshihiko Akaiwa and Yasushi Yamamoto, "An Open-Loop Digital Predistortor Based on Memory Polynomial Inverses for Linearization of RF Power Amplifier", International Journal of RF and Microwave Computer-Aided Engineering, Vol. 21 No. 5, pp. 589-595, September 2011

As stated above, the learning method of learning a compensation coefficient by the use of a feedback signal whose high-frequency components are removed is proposed. However, if components in a part of frequency bands are simply removed in order to limit a bandwidth, distortion included in the part of the frequency bands is not taken into consideration. Accordingly, there is room for improvement in the accuracy of compensation coefficient learning in the above learning method.

SUMMARY

According to an aspect, there is provided a distortion compensation apparatus including a predistorter which gives an input signal inputted to a power amplifier distortion corresponding to a compensation coefficient, a first band limiter which limits components in a second frequency band other than a first frequency band of a feedback signal fed back from the power amplifier and which distorts components in the first frequency band according to the limited components in the second frequency band, and a learner which updates the compensation coefficient on the basis of the distorted feedback signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
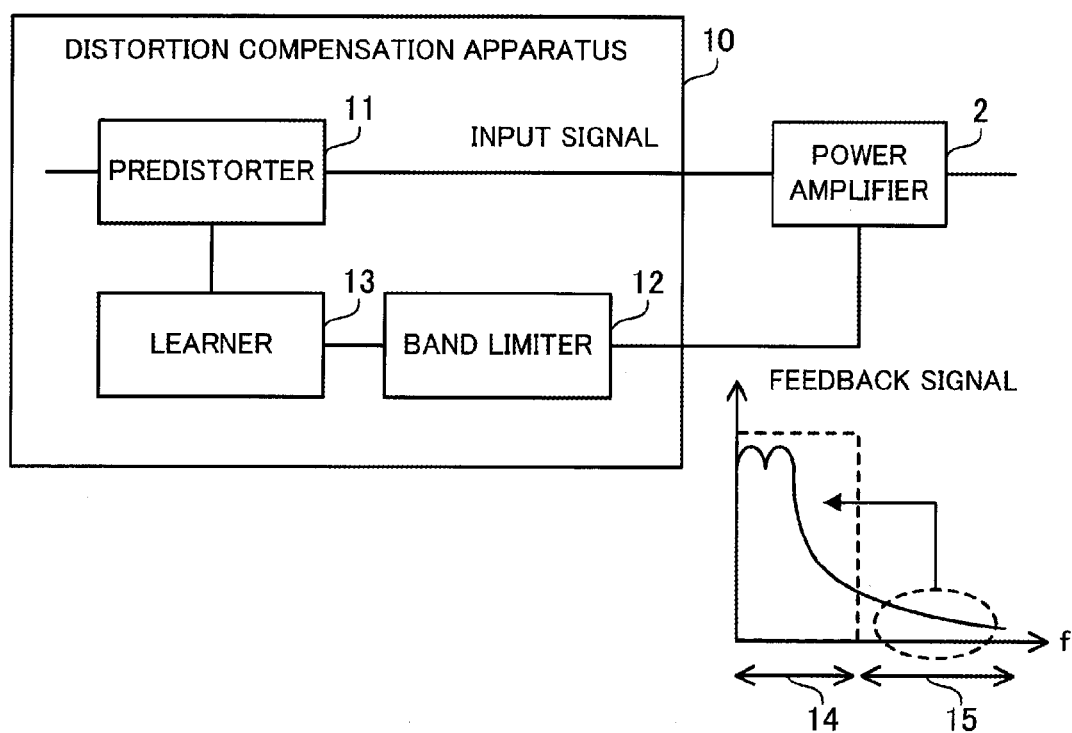
FIG. 1 illustrates an example of a distortion compensation apparatus according to a first embodiment.

Embodiments will now be described with reference to the accompanying drawings, wherein like reference numerals refer to like elements throughout.

First Embodiment

FIG. 1 illustrates an example of a distortion compensation apparatus according to a first embodiment.

A distortion compensation apparatus 10 according to a first embodiment compensates for nonlinear distortion caused by a power amplifier 2. This nonlinear distortion occurs in an output signal from the power amplifier 2 because there is a nonlinear relationship (amplification characteristic) between the level of an input signal to the power amplifier 2 and the level of an output signal from the power amplifier 2. The power amplifier 2 may be an amplifier referred to as an HPA (High Power Amplifier). The power amplifier 2 and the distortion compensation apparatus 10 are included in, for example, a radio transmitter which transmits a radio signal. The radio transmitter is a radio base station, a radio relay unit, a radio terminal unit, or the like.

The distortion compensation apparatus 10 includes a predistorter 11, a band limiter 12, and a learner 13.

The predistorter 11 gives an input signal inputted to the power amplifier 2 distortion corresponding to a compensation coefficient. Distortion given by the predistorter 11 preferably is distortion having a characteristic reverse to the nonlinear characteristic of the power amplifier 2 which cancels nonlinear distortion caused by the power amplifier 2. As described later, the compensation coefficient used by the predistorter 11 is calculated through learning by the learner 13. The compensation coefficient may be a coefficient included in a polynomial or a coefficient which is associated with a level of an input signal and which is stored in a lookup table (LUT). A memory effect which the power amplifier 2 has may or may not be taken into consideration in the polynomial indicative of a characteristic reverse to the nonlinear characteristic of the power amplifier 2.

The band limiter 12 is placed on a feedback path along which a feedback signal is transmitted from the power amplifier 2 to the learner 13, and limits a bandwidth of the feedback signal so that the bandwidth of the feedback signal will be smaller than that of an output signal from the power amplifier 2. The band limiter 12 does not limit components in a frequency band (first frequency band) but limits components in a frequency band 15 (second frequency band). For example, the frequency band 14 is a low-frequency band including frequencies lower than and equal to a determined frequency, and the frequency band 15 is a high-frequency band other than the frequency band 14. It is desirable to remove components in the frequency band 15 from the feedback signal as much as possible. For example, the band limiter 12 uses a low pass filter (LPF) for removing components in the frequency band 15 from the feedback signal.

Furthermore, the band limiter 12 distorts components in the frequency band 14 according to components in the frequency band 15. For example, the band limiter 12 converts components in the frequency band included in the feedback signal to signals which belong to the frequency band 14, and combines the signals with original components in the frequency band 14 included in the feedback signal. There preferably is a correlation between the components in the frequency band 15 before the conversion and the signals in the frequency band 14 after the conversion. This conversion between different frequencies is a nonlinear conversion and is realized by the use of a nonlinear unit, such as an envelope detector or an absolute function.

As a result, not only the characteristics of the components in the frequency band 14 included in the output signal from the power amplifier 2 but also the characteristics of the components in the frequency band 15 limited by the band limiter 12 are reflected in the feedback signal which passes through the band limiter 12. The band limiter 12 may include a filter which allows the components in the frequency band 14 to pass and which limits the components in the frequency band 15 and a nonlinear unit which converts a signal in the frequency band 15 to a signal in the frequency band 14. For example, the band limiter 12 includes an LPF and an envelope detector which converts a signal in a high-frequency band to a signal in a low-frequency band.

The learner 13 acquires a feedback signal which passes through the band limiter 12, and updates a compensation coefficient used by the predistorter 11 on the basis of the acquired feedback signal. The model inversion method may be used as a compensation coefficient learning method. If the model inversion method is used, the learner 13 learns a compensation coefficient in the following way.

For example, the distortion compensation apparatus 10 has a forward path for generating a reference signal, which is compared with a feedback signal, from an input signal to which the predistorter 11 gives distortion. The reference signal is generated by converting the input signal on the basis of a model of the amplification characteristic of the power amplifier 2. The learner 13 compares the feedback signal and the reference signal and updates the model so as to make an error between them smaller. The learner 13 calculates a compensation coefficient indicative of a characteristic (inverse model) reverse to the nonlinear characteristic of a model after the update. By doing so, the learner 13 updates a compensation coefficient used by the predistorter 11.

In order to compare the feedback signal and the reference signal, a second band limiter corresponding to the band limiter 12 may be placed on the forward path. For example, of the reference signal, the second band limiter does not limit components in the frequency band 14 but limits components in the frequency band 15. In addition, the second band limiter distorts the components in the frequency band 14 of the reference signal according to the limited components in the frequency band 15. In this case, the learner 13 compares the feedback signal distorted by the band limiter 12 and the reference signal distorted by the second band limiter, and determines an error between them.

With the distortion compensation apparatus 10 according to the first embodiment the bandwidth of the feedback signal fed back from the power amplifier 2 to the learner 13 is limited by the band limiter 12. This reduces the load on the distortion compensation apparatus 10 and the costs of various signal processing units such as an ADC. Furthermore, with the distortion compensation apparatus 10 components in the frequency band 14 which pass through the band limiter 12 are distorted according to components in the frequency band 15 limited by the band limiter 12. As a result, the learner 13 can learn a compensation coefficient with the characteristics of the components in the frequency band 15, such as distortion which occurs in the frequency band 15, which may be removed by the band limiter 12 taken into consideration. Accordingly, the accuracy of compensation coefficient learning is improved.

Second Embodiment

Figure 2:
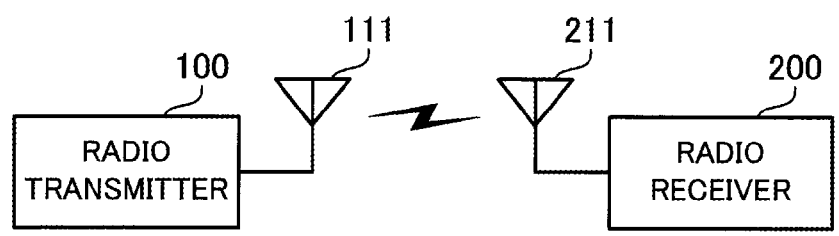
FIG. 2 illustrates an example of a radio communication system according to a second embodiment.

FIG. 2 illustrates an example of a radio communication system according to a second embodiment.

A radio communication system according to a second embodiment includes a radio transmitter 100 and a radio receiver 200. The radio transmitter 100 includes an antenna 111 and uses the antenna 111 for transmitting a radio signal to the radio receiver 200. The radio receiver 200 includes an antenna 211 and uses the antenna 211 for receiving a radio signal from the radio transmitter 100.

In the second embodiment a transmission process performed by the radio transmitter 100 will mainly be described. However, a radio communication apparatus corresponding to the radio transmitter 100 may further perform a receiving process or a radio communication apparatus corresponding to the radio receiver 200 may further perform a transmission process. Furthermore, this radio communication system may be a one-to-many connection system in which a radio base station communicates with a plurality of radio terminal units. In that case, for example, the radio transmitter 100 may be a radio base station and the radio receiver 200 may be a radio terminal unit. Furthermore, for example, the radio transmitter 100 may be a radio terminal unit and the radio receiver 200 may be a radio base station. In addition, at least one of the radio transmitter 100 and the radio receiver 200 may be a radio relay apparatus.

As described later, the radio transmitter 100 includes a power amplifier which amplifies a transmitted signal and a predistorter which compensates for nonlinear distortion caused by the power amplifier. The predistorter gives an input signal inputted to the power amplifier nonlinear distortion reverse to the nonlinear distortion caused by the power amplifier. At this time the predistorter uses a compensation coefficient indicative of nonlinearity reverse to the nonlinearity of the power amplifier. The radio transmitter 100 adaptively changes a compensation coefficient used by the predistorter on the basis of a feedback signal acquired from the power amplifier. The nonlinear amplification characteristic of the power amplifier and nonlinear distortion which the predistorter gives to an input signal will now be described.

Figure 3:
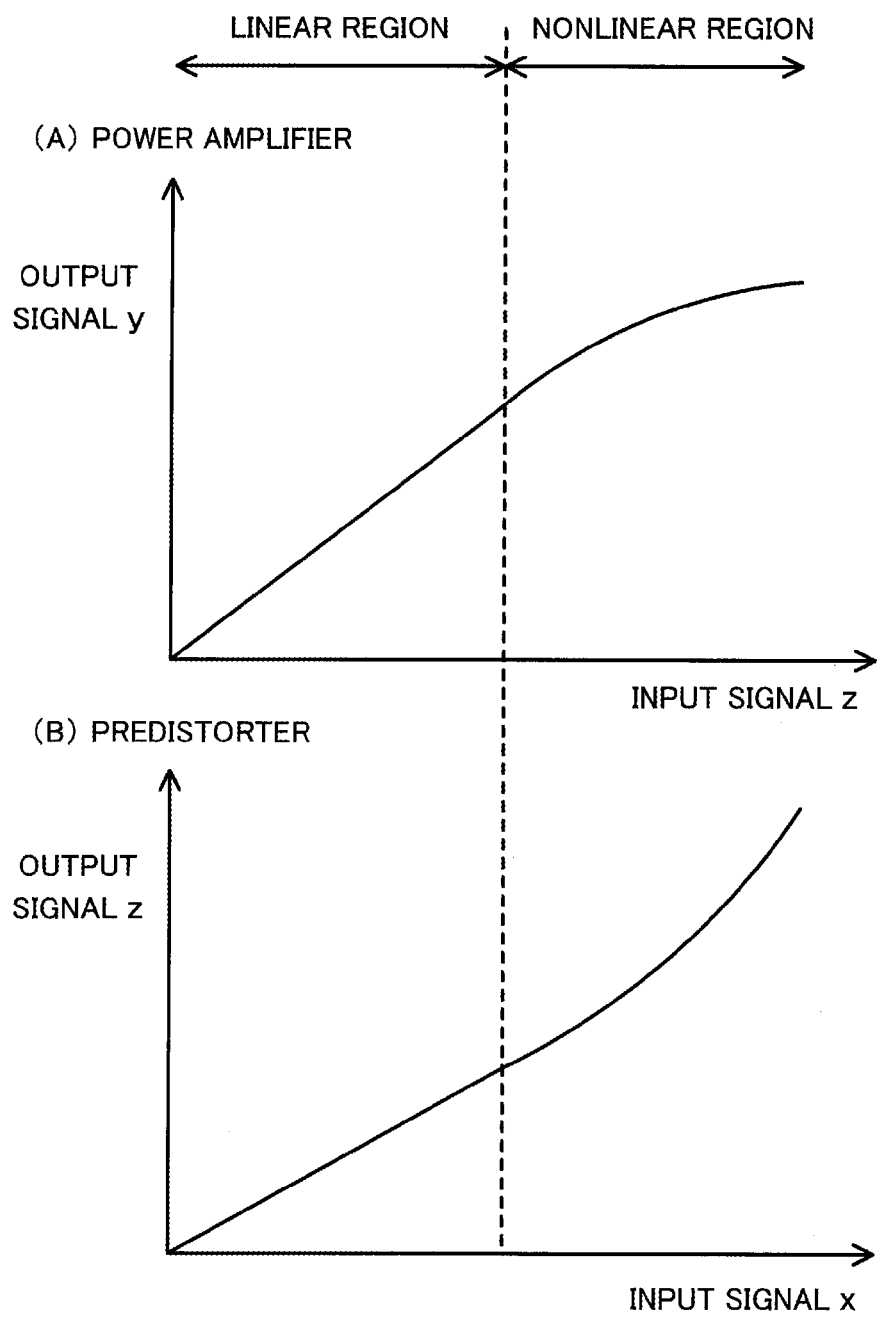
FIG. 3 is a graph indicative of examples of the characteristics of a power amplifier and a predistorter.

FIG. 3 is a graph indicative of examples of the characteristics of the power amplifier and the predistorter.

The amplification characteristic of the power amplifier is approximately linear in a region in which the amplitude of an input signal is small (linear region). That is to say, when the amplitude of an input signal is small, the amplification factor is approximately constant and there is a linear relationship between the amplitude of the input signal and the amplitude of an output signal. On the other hand, the amplification characteristic of the power amplifier is nonlinear in a region in which the amplitude of an input signal is large (nonlinear region). That is to say, when the amplitude of an input signal is large, the amplification factor is not constant and changes according to the amplitude of the input signal. There is a nonlinear relationship between the amplitude of an input signal and the amplitude of an output signal. Normally, the amplification factor in the nonlinear region is smaller than the amplification factor in the linear region. In addition, as the amplitude of an input signal becomes larger, the amplification factor falls. An input signal which belongs to the nonlinear region may be inputted to the power amplifier included in the radio transmitter 100.

The predistorter preferably distorts an input signal so that it will cancel the nonlinearity of the amplification factor of the power amplifier for linearization. The gain of the predistorter is approximately linear in a region in which the amplitude of an input signal is small (linear region). This is the same with the power amplifier. The amplitude of an output signal may be approximately the same as the amplitude of an input signal in the linear region. On the other hand, the gain of the predistorter is nonlinear according to a change in the amplification factor of the power amplifier in a region in which the amplitude of an input signal is large (nonlinear region). The gain in the nonlinear region is larger than the gain in the linear region in contrast with the amplification factor of the power amplifier. In addition, as the amplitude of an input signal becomes larger, the gain rises. That is to say, the predistorter gives an input signal gain so as to make up for a fall in the amplification factor of the power amplifier in the nonlinear region.

Figure 4:
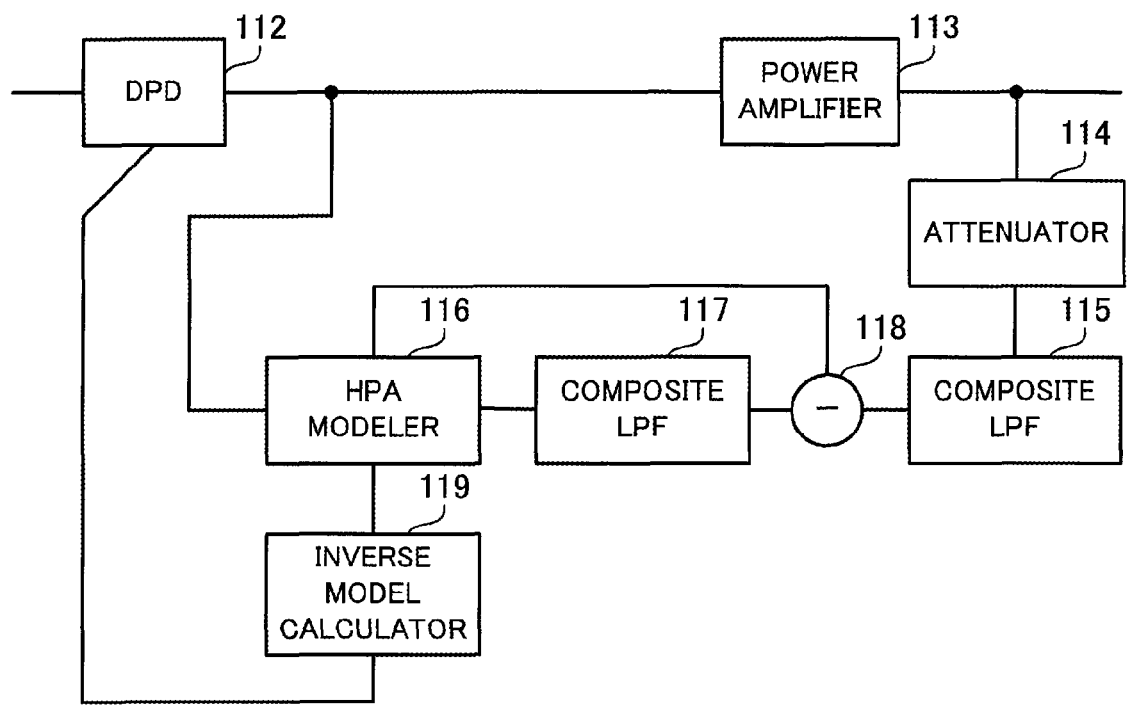
FIG. 4 is a block diagram of an example of a radio transmitter.

FIG. 4 is a block diagram of an example of a radio transmitter.

The radio transmitter 100 includes a digital predistorter (DPD) 112, a power amplifier 113, an attenuator 114, composite LPFs 115 and 117, an HPA modeler 116, a subtracter 118, and an inverse model calculator 119. The DPD 112 is an example of the predistorter 11 in the first embodiment. The power amplifier 113 is an example of the power amplifier 2 in the first embodiment. The composite LPF 115 is an example of the band limiter 12 in the first embodiment. A group of the HPA modeler 116, the subtracter 118, and the inverse model calculator 119 is an example of the learner 13 in the first embodiment.

The DPD 112 is a predistorter which performs digital distortion compensation on an input signal inputted to the power amplifier 113. The DPD 112 holds a set of compensation coefficients used for distortion compensation. The DPD 112 may include a volatile or nonvolatile memory for storing compensation coefficients. For example, the DPD 112 determines gain to be given to each input signal by the use of a polynomial indicative of the correspondence between a level (amplitude, power value, or the like) of an original input signal and a level (amplitude, power value, or the like) after distortion compensation. The polynomial includes a variable indicative of the level of an input signal and compensation coefficients. If a memory effect of the power amplifier 113 is pronounced, that is to say, if the amplification factor of the power amplifier 113 depends not only on the level of a current input signal but also on the level of a past input signal, then the polynomial may include a variable indicative of the level of an input signal a determined number before the current input signal. However, the DPD 112 may perform distortion compensation by the use of a lookup table (LUT) which stores compensation coefficients.

Compensation coefficients used for distortion compensation are calculated through training. Compensation coefficient learning (compensation coefficient update) is repeated plural times in the training. Each time learning is performed once, a plurality of sample signals are inputted to the DPD 112. The DPD 112 performs distortion compensation on each sample signal in the same way that the DPD 112 uses at the time of transmitting a data signal to the radio receiver 200. Each time learning is performed once by the use of a set of sample signals, a compensation coefficient calculated by the inverse model calculator 119 is copied to the DPD 112. If the DPD 112 continues the training, the DPD 112 uses the compensation coefficient after the update for performing distortion compensation on a set of sample signals inputted next.

Learning using sample signals is repeated in this way during the training and a compensation coefficient is updated repeatedly. As the number of times learning is repeated increases, the accuracy of a compensation coefficient improves. The DPD 112 may use an initial value as a compensation coefficient in the first learning. An initial value of a compensation coefficient may be a value for which sample signals are not compensated for. The number of sample signals used for performing learning once corresponds to, for example, one radio frame (10 ms, for example). As the number of sample signals used for performing learning once increases, the accuracy of the learning improves. Sample signals may be generated at random or be prepared in advance for training. Sets of sample signals used for performing learning plural times may be different from one another.

The power amplifier 113 amplifies an input signal on which the DPD 112 has performed distortion compensation. A DAC (Digital Analog Converter) may be placed between the DPD 112 and the power amplifier 113. The power amplifier 113 may be an amplifier referred to as an HPA. When the radio transmitter 100 performs radio communication with the radio receiver 200, a transmitted signal amplified by the power amplifier 113 is outputted from the antenna 111. While the DPD 112 is performing training, the power amplifier 113 amplifies sample signals on which the DPD 112 has performed distortion compensation. The power amplifier 113 has a nonlinear amplification characteristic. Accordingly, if the DPD 112 does not perform distortion compensation at this time, nonlinear distortion may occur in an output signal.

During training, the attenuator 114 attenuates an output signal from the power amplifier 113 and provides the attenuated output signal as a feedback signal. The attenuator 114 multiplies the amplitude of the output signal from the power amplifier 113 by a real number. The attenuation factor of the attenuator 114 may be set in advance to a constant value. For example, it is assumed that the ideal amplification factor of the power amplifier 113 obtained in the case of linearizing the amplification characteristic is G. Then the gain of the attenuator 114 may be set to 1/G.

The composite LPF 115 limits a bandwidth of a feedback signal acquired from the attenuator 114. An ADC, for example, is placed at the subsequent stage of the composite LPF 115. The bandwidth of the feedback signal becomes small, so an ADC whose signal processing capability is poor can be used. The composite LPF 115 uses, for example, an LPF for removing high-frequency components included in the feedback signal. As described later, however, the composite LPF 115 not only removes high-frequency components but also adds characteristics corresponding to the high-frequency components to low-frequency components of the feedback signal. By doing so, the characteristics of distortion included in the removed high-frequency components are transmitted to a subsequent stage.

The HPA modeler 116 holds a model indicative of estimated nonlinearity of the power amplifier 113. The model is represented by the use of, for example, a polynomial including a variable indicative of the level of a sample signal and coefficients. A memory effect may or may not be taken into consideration in this model. The HPA modeler 116 may include a volatile or nonvolatile memory for storing the model.

During training, the HPA modeler 116 acquires a sample signal on which the DPD 112 has performed distortion compensation and which is not yet inputted to the power amplifier 113. The HPA modeler 116 applies a model to the acquired sample signal. By doing so, the HPA modeler 116 converts the sample signal to a reference signal. If the model reflects a memory effect, then the level of a past sample signal is also taken into consideration. If the model accurately indicates the nonlinearity of the power amplifier 113, then the reference signal outputted from the HPA modeler 116 matches a feedback signal outputted from the attenuator 114. On the other hand, if the accuracy of the model is low, then there occurs an error between the reference signal outputted from the HPA modeler 116 and a feedback signal outputted from the attenuator 114.

Furthermore, the HPA modeler 116 acquires an error signal from the subtracter 118 during the training. The HPA modeler 116 updates the model on the basis of the error signal. For example, the HPA modeler 116 updates a coefficient in a polynomial so as to minimize the error between the feedback signal and the reference signal (so as to make the error approach zero). A statistical technique, such as a least mean square algorithm, is used for calculating a coefficient.

The composite LPF 117 is placed on a forward path and corresponds to the composite LPF 115 placed on a feedback path. The composite LPF 117 limits a bandwidth of a reference signal acquired from the HPA modeler 116 by the same signal processing that is performed by the composite LPF 115. For example, the composite LPF 117 uses an LPF for removing high-frequency components included in the reference signal. However, the composite LPF 117 adds characteristics corresponding to the removed high-frequency components to low-frequency components of the reference signal. If the reference signal outputted from the HPA modeler 116 matches a feedback signal outputted from the attenuator 114, then the same characteristics that the feedback signal has are added to the low-frequency components of the reference signal.

During training, the subtracter 118 acquires a reference signal from the composite LPF 117 placed on the forward path, and acquires a feedback signal from the composite LPF 115 placed on the feedback path. The subtracter 118 subtracts the feedback signal from the reference signal, calculates an error, and outputs to the HPA modeler 116 an error signal indicative of the calculated error.

When the HPA modeler 116 completes model update on the basis of a set of sample signals, the inverse model calculator 119 calculates a compensation coefficient which represents nonlinearity reverse to that of the power amplifier 113 indicated by a model. For example, the inverse model calculator 119 calculates a compensation coefficient included in a polynomial corresponding to an inverse function of a function indicated by the model. If the model accurately indicates the nonlinearity of the power amplifier 113, then nonlinearity reverse to that nonlinearity represents an ideal distortion compensation.

If it is easy to directly find an inverse model from a definition of the model, then the inverse model calculator 119 may calculate the inverse model by acquiring from the HPA modeler 116 information (such as a coefficient included in a polynomial) indicative of the model. On the other hand, if it is not easy to directly find an inverse model from the definition of the model, then the inverse model calculator 119 may indirectly calculate the inverse model on the basis of sample signals converted by applying the model. This will be described later. The inverse model calculator 119 then copies a compensation coefficient calculated as the inverse model to the DPD 112.

The above compensation coefficient learning method may be referred to as a model inversion method. With the model inversion method a first phase in which a model is calculated and a second phase in which an inverse model is calculated from the model are performed each time compensation coefficient learning is performed once. In the first phase the HPA modeler 116 updates a model on the basis of an error signal corresponding to a determined number of sample signals so as to minimize an overall error. After the HPA modeler 116 ends model update and the first phase is completed, the inverse model calculator 119 calculates an inverse model in the second phase.

The attenuator 114, the composite LPFs 115 and 117, the HPA modeler 116, the subtracter 118, and the inverse model calculator 119 may be operated only during training. That is to say, while the radio transmitter 100 is performing radio communication with the radio receiver 200, they may be stopped.

As stated above, the method of directly calculating an inverse model from a definition of a model or the method of indirectly calculating an inverse model is possible as a method for an inverse model calculation by the inverse model calculator 119. An example of the structure of the inverse model calculator 119 which indirectly calculates an inverse model will now be described.

Figure 5:
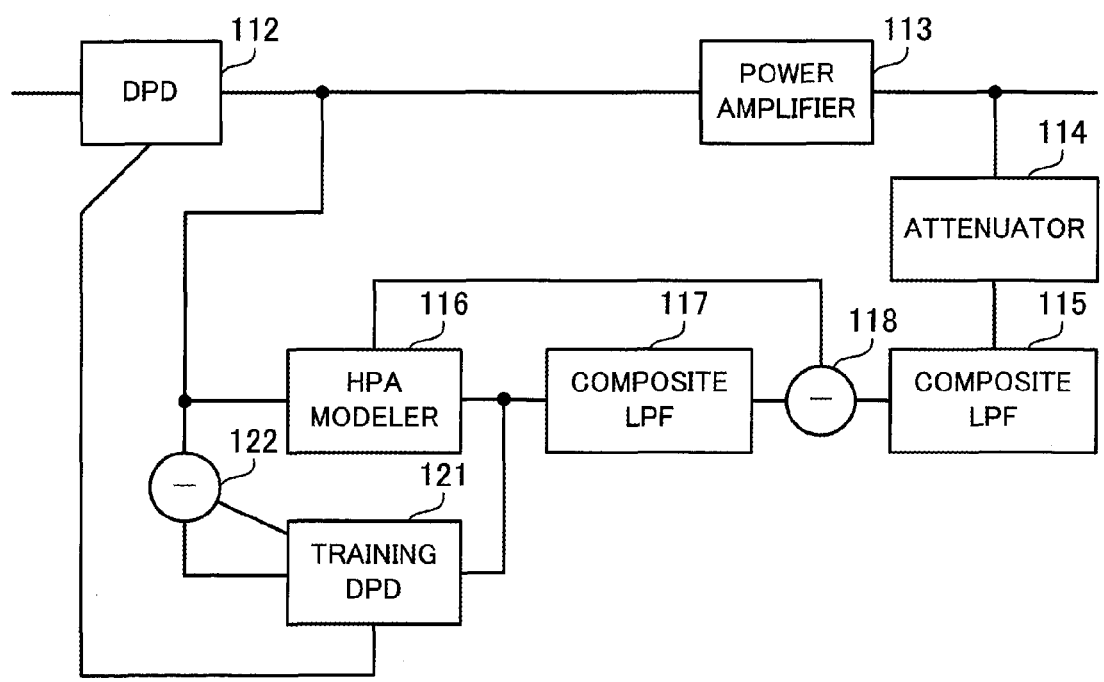
FIG. 5 is another block diagram of the example of a radio transmitter.

FIG. 5 is another block diagram of the example of a radio transmitter.

The inverse model calculator 119 includes a training DPD 121 and a subtracter 122. In this implementation example, a set of sample signals is also inputted to the DPD 112 in a second phase. A set of sample signals used in the second phase may be different from a set of sample signals used in a first phase.

During the second phase, the training DPD 121 performs the same distortion compensation that the DPD 112 performs. By doing so, the training DPD 121 learns a compensation coefficient. To be concrete, at the time when the second phase is begun, the training DPD 121 holds the same compensation coefficient that the DPD 112 holds. The training DPD 121 acquires as an ideal feedback signal a reference signal which is outputted from the HPA modeler 116 and which is not yet inputted to the composite LPF 117. The ideal feedback signal does not include distortion which occurs on the feedback path. Therefore, if a model calculated in the first phase accurately indicates the nonlinearity of the power amplifier 113, then it may safely be said that the accuracy of the ideal feedback signal is higher than that of a feedback signal acquired from the power amplifier 113.

The training DPD 121 performs distortion compensation on the ideal feedback signal by the use of the compensation coefficient and outputs the ideal feedback signal after the distortion compensation to the subtracter 122. The training DPD 121 performs distortion compensation on a sample signal to which a model of the power amplifier 113 is applied. Accordingly, it may safely be said that the training DPD 121 operates as a postdistorter.

In addition, the training DPD 121 acquires an error signal from the subtracter 122 and updates the compensation coefficient on the basis of the error signal. For example, the training DPD 121 updates the compensation coefficient included in a polynomial so as to minimize an error between the sample signal after the distortion compensation and the ideal feedback signal after the distortion compensation (so as to make the error approach zero). A statistical technique, such as a least-squares method, is used for calculating a compensation coefficient. The training DPD 121 copies the compensation coefficient after the update to the DPD 112 at the end of the second phase.

During the second phase, the subtracter 122 acquires an ideal feedback signal after distortion compensation from the training DPD 121. Furthermore, the subtracter 122 acquires a sample signal after distortion compensation from the DPD 112 so that it will be associated with the ideal feedback signal. In order to make the timing of the sample signal match the timing of the ideal feedback signal, a buffer memory may be placed between the DPD 112 and the subtracter 122. The subtracter 122 calculates an error by subtracting the ideal feedback signal from the sample signal, and outputs an error signal indicative of the error to the training DPD 121.

Figure 6:
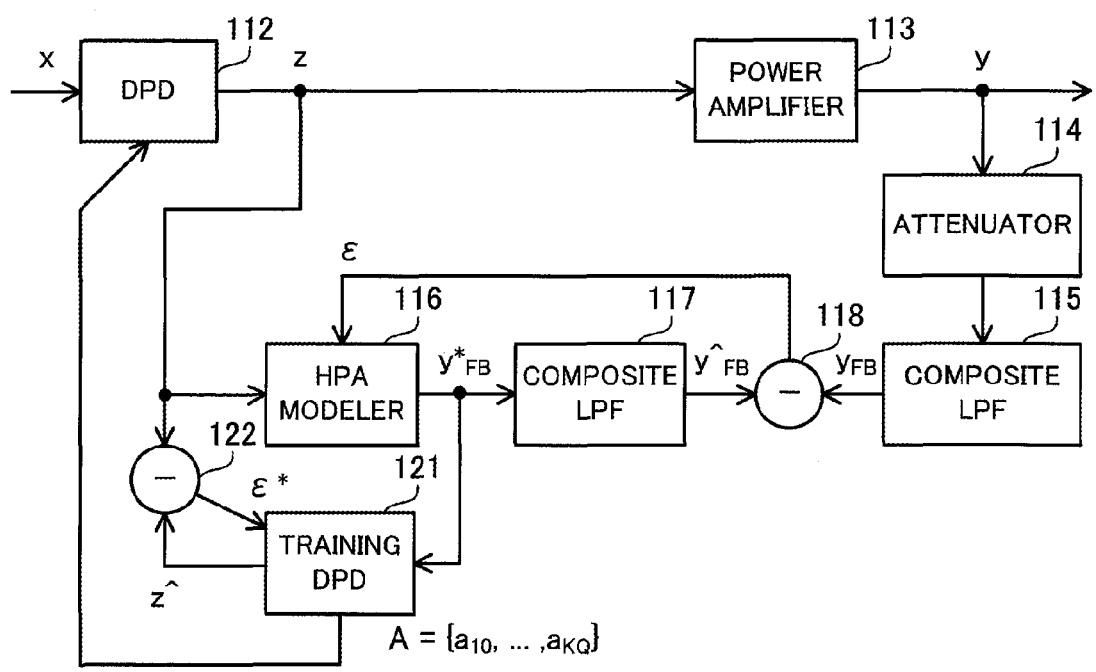
FIG. 6 is an example of the flow of a signal in a radio transmitter.

FIG. 6 is an example of the flow of a signal in the radio transmitter.

It is assumed that signal $x(n)$ is inputted as N sample signals to the DPD 112 in a first phase (n is an integer greater than or equal to 1 and smaller than or equal to N). The DPD 112 applies a compensation coefficient to signal $x(n)$ and outputs signal $z(n)$. The power amplifier 113 amplifies signal $z(n)$ and outputs signal $y(n)$. It is assumed that an ideal amplification factor obtained by linearizing the amplification characteristic of the power amplifier 113 is G. The attenuator 114 attenuates the amplitude of signal $y(n)$ to $1/G$ and outputs signal $y(n)/G$. The composite LPF 115 limits a bandwidth of signal $y(n)/G$ and outputs signal $y_{FB}(n)$.

Furthermore, the HPA modeler 116 applies a model to signal $z(n)$ and outputs signal $y*_{FB}(n)$, in parallel with the operation of the feedback path. The composite LPF 117 limits a bandwidth of signal $y*_{FB}(n)$ and outputs signal $y\char`\^_{FB}(n)$. The subtracter 118 calculates an error between signal $y\char`\^_{FB}(n)$ and signal $y_{FB}(n)$ and outputs signal $\epsilon(n)$. The HPA modeler 116 updates the model on the basis of signals $\epsilon(n)$ corresponding to the N sample signals so as to minimize an overall error.

The relationship between the composite LPFs 115 and 117 will now be supplemented. Signal $y_{FB}(n)$ generated on the feedback path and signal $\hat{y}_{FB}(n)$ generated on the forward path are defined as $$y_{FB}(n) = \text{LPF}(y(n)/G) + \delta(n)$$

$$y_{\hat{FB}}(n) = \text{LPF}(y^*_{FB}(n)) + \delta_{\hat{FB}}(n) \quad (1)$$

where LPF( ) indicates a function which removes low-frequency components, $\delta(n)$ indicates inter-symbol interference (ISI) which is distortion that occurs in signal $y_{FB}(n)$ passing through the composite LPF 115, and $\hat{\delta}(n)$ indicates inter-symbol interference which is distortion that occurs in signal $\hat{y}_{FB}(n)$ passing through the composite LPF 117.

Signal $\epsilon(n)$ calculated by the subtracter 118 is obtained by subtracting signal $y_{FB}(n)$ from signal $\hat{y}_{FB}(n)$ and is defined as $$\epsilon(n) = \hat{y}_{FB}(n) - y_{FB}(n) \quad (2)$$
$$= \{LPF(y^*_{FB}(n)) - LPF(y(n)/G)\} + \{\hat{\delta}_{FB}(n) - \delta(n)\}$$

If model learning is properly performed by the HPA modeler 116, signal $\epsilon(n)$, ideally, approaches zero. In this case, as indicated by $$\epsilon(n) \approx 0 \Rightarrow y_{FB}(n) \approx y_{FB}(n) \wedge \delta_{\hat{FB}}(n) \approx \delta(n) \quad (3)$$

signal $\hat{y}_{FB}(n)$ approximately matches signal $y_{FB}(n)$ and $\hat{\delta}(n)$ approximately matches $\delta(n)$. That is to say, $(\hat{\delta}(n)-\delta(n))$ approaches zero. By placing the composite LPF 115 on the feedback path and placing the composite LPF 117 corresponding to the composite LPF 115 on the forward path, each of inter-symbol interference which occurs in the composite LPF 115 and inter-symbol interference which occurs in the composite LPF 117 can cancel the other. Ideally, the HPA modeler 116 can ignore inter-symbol interference.

It is assumed that signal $x(n)$ which is the same as or different from that inputted to the DPD 112 in the first phase is inputted as N sample signals to the DPD 112 in a second phase. The DPD 112 applies the compensation coefficient to signal $x(n)$ and outputs signal $z(n)$. The HPA modeler 116 applies a model obtained by the update in the first phase to signal $z(n)$ and outputs signal $y^*_{FB}(n)$. However, it is possible to use, in the second phase, signal $z(n)$ saved in a buffer memory in the first phase instead of inputting signal $x(n)$ to the DPD 112.

At the time when the first phase is begun, the training DPD 121 holds the same compensation coefficient that the DPD 112 holds. The training DPD 121 applies the compensation coefficient to signal $y^*_{FB}(n)$ and outputs signal $\hat{z}(n)$. The subtracter 122 calculates an error between signal $z(n)$ and signal $\hat{z}(n)$ and outputs signal $\epsilon^*(n)$. The training DPD 121 updates the compensation coefficient on the basis of signals $\epsilon^*(n)$ corresponding to the N sample signals so as to minimize an overall error. The training DPD 121 then copies a compensation coefficient after the update to the DPD 112.

Compensation coefficient calculation by the training DPD 121 will now be supplemented. The DPD 112 converts signal $x(n)$ to signal $z(n)$ by the use of a polynomial in which a memory effect of the power amplifier 113 is taken into consideration. For example, as indicated by $$z(n) = \sum_{k=1}^{K} \sum_{q=0}^{Q} a_{kq} \cdot x(n-q) \cdot |x(n-q)|^{k-1} \quad (4)$$

$$z(\hat{n}) = \sum_{k=1}^{K} \sum_{q=0}^{Q} a_{kq} \cdot y^*_{FB}(n-q) \cdot |y^*_{FB}(n-q)|^{k-1}$$

signal $z(n)$ is defined as the sum of the terms $a_{kq} \cdot x(n-q) \cdot |x(n-q)|^{k-1}$ where k is an integer greater than or equal to 1 and smaller than or equal to K and q is an integer greater than or equal to 0 and smaller than or equal to Q (K and Q are determined integers).

A polynomial indicative of signal $z(n)$ includes variables corresponding to the last (Q+1) input signals. This polynomial is a Kth-order polynomial and includes first-order through Kth-order terms for each of the (Q+1) input signals. $a_{kq}$ is a compensation coefficient indicative of the weight of each term. The polynomial includes $(K \times (Q+1))$ compensation coefficients. That is to say, the polynomial includes the terms $a_{10} \cdot x(n)$, $a_{20} \cdot x(n) \cdot |x(n)|$, $a_{30} \cdot x(n) \cdot |x(n)|^2$, ... and $a_{K0} \cdot x(n) \cdot |x(n)|^{K-1}$ for $x(n)$ which is a latest input signal. In addition, the polynomial includes the terms $a_{1Q} \cdot x(n-Q)$, $a_{2Q} \cdot x(n-Q) \cdot |x(n-Q)|$, ... and $a_{KQ} \cdot x(n-Q) \cdot |x(n-Q)|^{K-1}$ for $x(n-Q)$ which is an input signal Q before the latest input signal.

The training DPD 121 uses the same polynomial that the DPD 112 uses for converting signal $y^*_{FB}(n)$ to signal $\hat{z}(n)$. For example, as indicated by expression (4), signal $\hat{z}(n)$ is defined as the sum of the terms $a_{kq} \cdot y^*_{FB}(n-q) \cdot |y^*_{FB}(n-q)|^{k-1}$. This polynomial includes $(K \times (Q+1))$ compensation coefficients. This is the same with the polynomial indicative of signal $z(n)$.

As indicated by $$\epsilon^*(n) = z(n) - z(\hat{n}) \quad (5)$$

signal $\epsilon^*(n)$ outputted from the subtracter 122 is defined as an error between signal $z(n)$ and signal $\hat{z}(n)$. Signal $z(n)$ is defined from expression (4) and expression (5) as $$z(n) = z(\hat{n}) + \epsilon^*(n) \quad (6)$$

$$= \sum_{k=1}^{K} \sum_{q=0}^{Q} a_{kq} \cdot y^*_{FB}(n-q) \cdot |y^*_{FB}(n-q)|^{k-1} + \epsilon^*(n)$$

The training DPD 121 uses a statistical technique, such as a least-squares method, for calculating $a_{kq}$ by which the sum of the squares of $\epsilon^*(n)$ is minimized. At this time the terms $y^*_{FB}(n-q)$, $y^*_{FB}(n-q) \cdot |y^*_{FB}(n-q)|$, $y^*_{FB}(n-q) \cdot |y^*_{FB}(n-q)|^2$, ..., and $y^*_{FB}(n-q) \cdot |y^*_{FB}(n-q)|^{k-1}$ which differ in order number may be treated as different independent variables and multiple regression analysis may be performed.

Results obtained by substituting 0, 1, and N−1 for n in expression (6) can be represented in block in a matrix format as $$Z = Y \cdot A + \epsilon^* \quad (7)$$

where:
$Z = [z(0), z(1), \ldots, z(N-1)]^T$
$Y = [Y_{10}, \ldots, Y_{K0}, \ldots, Y_{KQ}]$
$Y_{kq} = [y^*_{kq}(0), \ldots, y^*_{kq}(N-1)]^T$
$y^*_{kq}(n) = y^*_{FB}(n-q) \cdot |y^*_{FB}(n-q)|^{k-1}$
$A = [a_{10}, \ldots, a_{K0}, \ldots, a_{KQ}]^T$
$\epsilon^* = [\epsilon^*(0), \epsilon^*(1), \ldots, \epsilon^*(N-1)]^T$ where Z is a column vector of N rows in which $z(n)$ are enumerated, A is a column vector of $(K \times (Q+1))$ rows in which compensation coefficients are enumerated, $\epsilon^*$ is a column vector of N rows in which $\epsilon^*(n)$ are enumerated, and Y is a matrix of N rows and $(K \times (Q+1))$ columns. Y can be resolved into (K×(Q+1)) column vectors $Y_{kq}$ and $Y_{kq}$ is a column vector of N rows in which $y^*_{FB}(n-q) \cdot |y^*_{FB}(n-q)|^{k-1}$ are enumerated for some k and q. If the least-squares method is used for minimizing $\epsilon^*$, then A can be solved as $$A = (Y^T \cdot Y)^{-1} \cdot Y^T \cdot Z \qquad (8)$$

Signal processing by the composite LPFs 115 and 117 will now be described.

Figure 7:
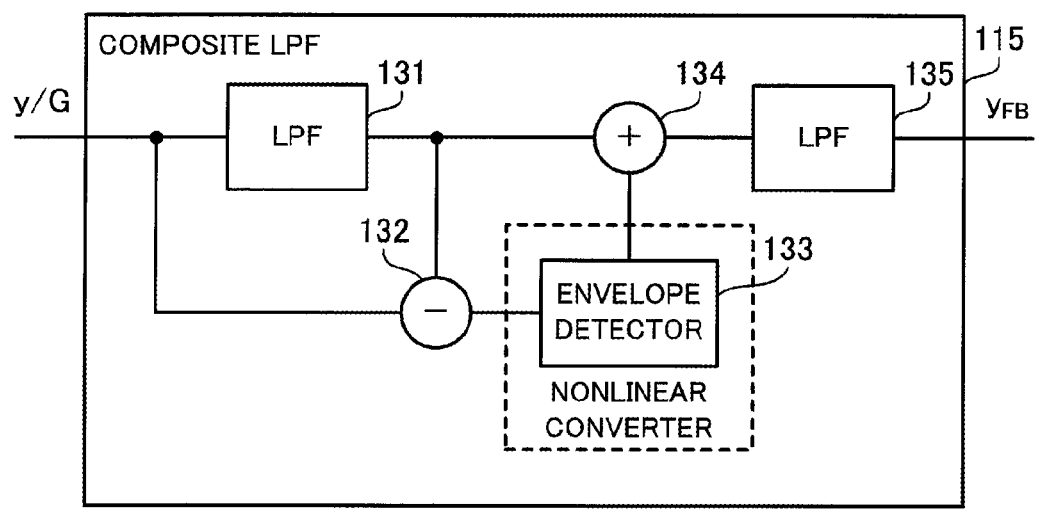
FIG. 7 is a block diagram of an example of a composite LPF.

FIG. 7 is a block diagram of an example of the composite LPF.

The composite LPF 115 includes LPFs 131 and 135, a subtracter 132, an envelope detector 133, and an adder 134. The composite LPF 117 has the same structure that the composite LPF 115 has. However, the composite LPF 115 acquires signal y(n)/G and outputs signal $y_{FB}(n)$. On the other hand, the composite LPF 117 acquires signal $y^*_{FB}(n)$ and outputs signal $\hat{y}F_B(n)$.

When the LPF 131 acquires signal y(n)/G from the attenuator 114 as a feedback signal, the LPF 131 allows low-frequency components of the feedback signal at frequencies lower than and equal to a determined frequency to pass, and removes the other high-frequency components. By doing so, the LPF 131 limits a bandwidth of the feedback signal. However, the composite LPF 115 may use a filter of another type, such as a BPF (Band Pass Filter), for limiting a bandwidth of the feedback signal.

The subtracter 132 subtracts from the feedback signal inputted to the LPF 131 the feedback signal whose bandwidth is limited by the LPF 131. As a result, the high-frequency components included in the original feedback signal are extracted. However, the composite LPF 115 may use another method for extracting the high-frequency components from the feedback signal.

The envelope detector 133 is an example of a nonlinear converter which converts in accordance with a determined conversion method a signal in a high-frequency band extracted by the subtracter 132 to a signal in a low-frequency band which can pass through the LPFs 131 and 135. The envelope detector 133 detects an envelope of the signal extracted by the subtracter 132, and generates a signal whose frequency is lower than that of the signal extracted by the subtracter 132.

There is a correlation between signals in the high-frequency band acquired by the envelope detector 133 and signals in the low-frequency band generated by the envelope detector 133. That is to say, signals in the high-frequency band having different characteristics are converted to signals in the low-frequency band having different characteristics. However, the composite LPF 115 may use a method other than envelope detection for converting a signal in the high-frequency band to a signal in the low-frequency band. For example, an absolute function which calculates the absolute value of each signal may be used as a nonlinear converter. Circuit scale or complexity is reduced by the use of an envelope detector or an absolute function, compared with a case where a frequency shifter which shifts a frequency spectrum from a high-frequency band to a low-frequency band in its original condition is used.

The adder 134 combines a feedback signal which has passed through the LPF 131 with a signal generated by the envelope detector 133. By doing so, characteristics of high-frequency components removed by the LPF 131 are added to low-frequency components which pass through the LPFs 131 and 135.

The LPF 135 prevents power leakage into a high-frequency band caused by signal combining. A pass band of the LPF 135 may be the same as a pass band of the LPF 131. However, if power leakage caused by signal combining is sufficiently small, then the LPF 135 may be omitted.

Figure 8:
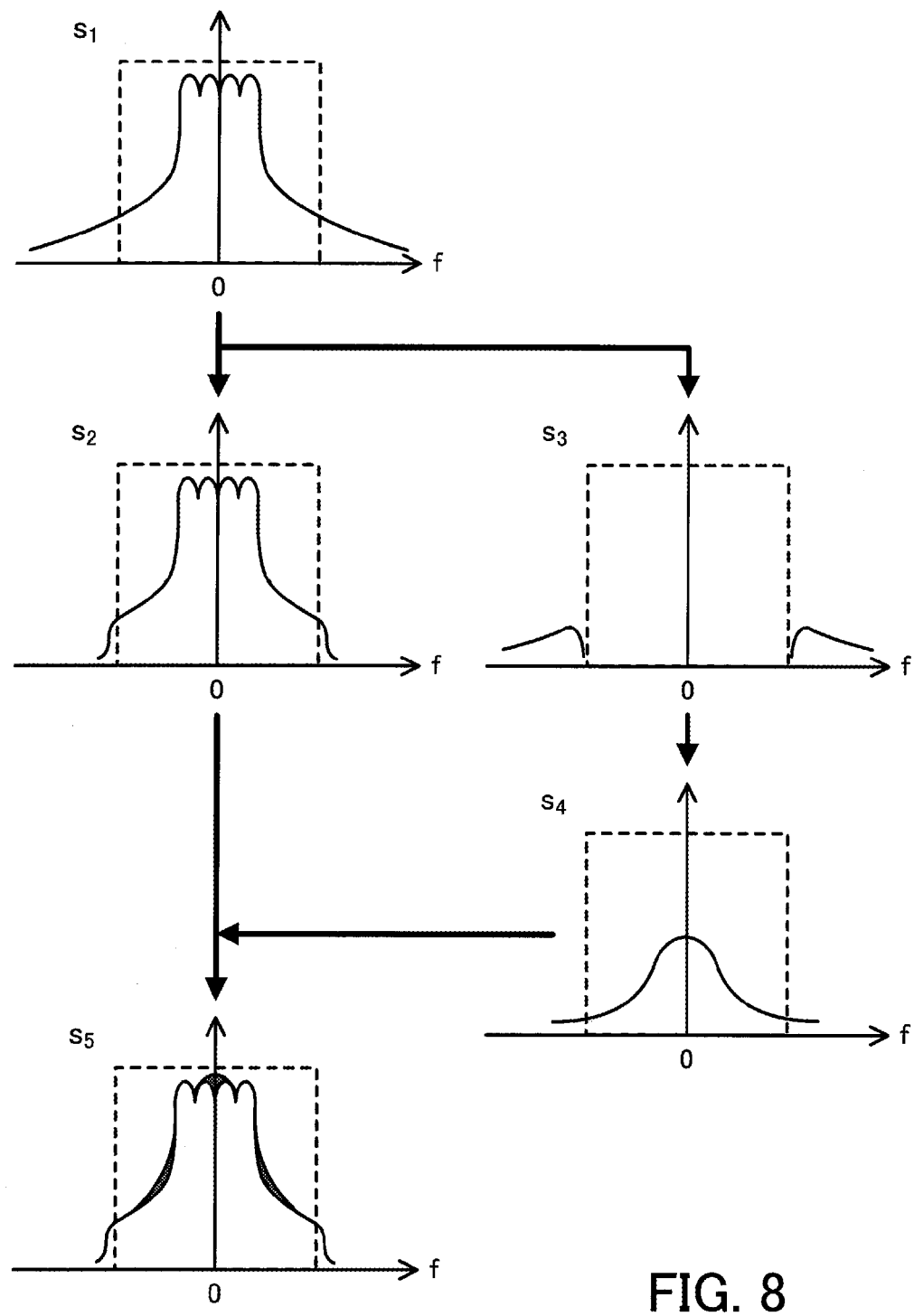
FIG. 8 is an example of a change in frequency spectrum in a composite LPF.

FIG. 8 is an example of a change in frequency spectrum in the composite LPF.

In FIG. 8, negative frequencies are also taken into consideration and a frequency spectrum which is left-right symmetrical with respect to a y-axis is illustrated. A frequency spectrum of a signal $s_1$ outputted from the attenuator 114 includes IMD (Inter Modulation Distortion) outside a desired frequency band used for data communication. A pass band of the composite LPF 115 is set to a frequency band in which the absolute value of a frequency is smaller than or equal to a threshold and which is wider than the desired frequency band used for data communication. Hereinafter, intermodulation distortion included in the pass band may be referred to as low-frequency IMD and intermodulation distortion included in a cutoff band removed by the composite LPF 115 may be referred to as high-frequency IMD.

The composite LPF 115 extracts from the signal $s_1$ a signal $s_2$ in the pass band including the low-frequency IMD and a signal $s_3$ in the cutoff band including the high-frequency IMD. The composite LPF 115 converts the extracted signal $s_3$ to a signal $s_4$ in the pass band. In this case, there is a correlation between a frequency spectrum of the signal $s_3$ and a frequency spectrum of the signal $s_4$. The composite LPF 115 then combines the signal $s_2$ with the signal $s_4$ to generate a signal $s_5$. The composite LPF 117 performs on a reference signal the same process that is performed by the composite LPF 115.

There is a great error between a feedback signal and a reference signal until a model held by the HPA modeler 116 converges. At this time not only low-frequency IMD but also characteristics corresponding to high-frequency IMD are added to the feedback signal and the reference signal whose bandwidths are limited, so the HPA modeler 116 updates the model with the differences between the characteristics corresponding to the high-frequency IMD added to the feedback signal and the reference signal taken into consideration. On the other hand, when a model held by the HPA modeler 116 converges, an error between to a feedback signal and a reference signal approaches zero. At this time characteristics corresponding to high-frequency IMD added to the feedback signal cancel characteristics corresponding to high-frequency IMD added to the reference signal. Therefore, processes performed by the composite LPFs 115 and 117 do not have an influence on the HPA modeler 116. That is to say, by inserting the composite LPFs 115 and 117, the accuracy of a model held by the HPA modeler 116 improves.

A procedure for training by the DPD 112 will now be described.

Figure 9:
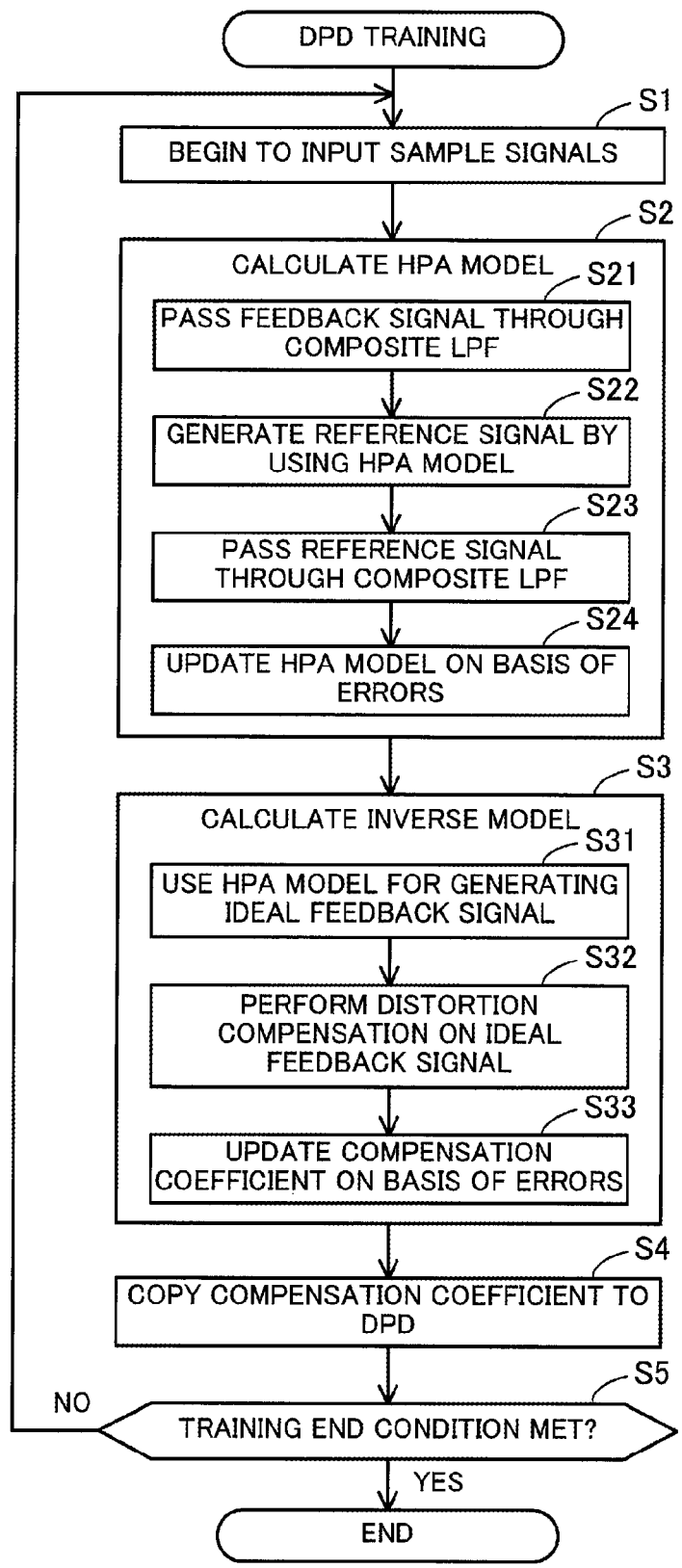
FIG. 9 is a flow chart of an example of a procedure for DPD training.

FIG. 9 is a flow chart of an example of a procedure for DPD training.

(S1) The radio transmitter 100 begins to input sample signals to the DPD 112. The sample signals correspond to, for example, one radio frame and are generated at random. The DPD 112 performs distortion compensation on each sample signal inputted. The power amplifier 113 amplifies each sample signal on which distortion compensation has been performed. The attenuator 114 attenuates output from the power amplifier 113 at a determined attenuation factor to generate a feedback signal.

(S2) The HPA modeler 116 calculates a model of the power amplifier 113 in a first phase. The first phase includes the following steps S21 through S24.

(S21) The composite LPF 115 limits a bandwidth of the feedback signal acquired from the attenuator 114. At this time the composite LPF 115 adds characteristics corresponding to high-frequency IMD included in a cutoff band (high-frequency band) to a signal in a pass band (low-frequency band).

(S22) The HPA modeler 116 applies a model currently held by the HPA modeler 116 to each sample signal acquired from the DPD 112 to generate a reference signal.

(S23) The composite LPF 117 limits a bandwidth of the reference signal acquired from the HPA modeler 116. At this time the composite LPF 117 adds characteristics corresponding to high-frequency IMD included in a cutoff band (high-frequency band) to a signal in a pass band (low-frequency band).

(S24) The subtracter 118 acquires from the composite LPF 117 the reference signal whose bandwidth is limited, and acquires from the composite LPF 115 the feedback signal whose bandwidth is limited. The subtracter 118 generates an error signal indicative of an error between the acquired reference signal and the acquired feedback signal. The generation of the above feedback signal, reference signal, and error signal are performed (N) times the number of which is equal to that of the sample signals used in the first phase. The HPA modeler 116 uses N error signals and a statistical technique, such as a least mean square algorithm, and updates the model of the power amplifier 113 so as to minimize an overall error.

(S3) In a second phase, the training DPD 121 calculates a compensation coefficient indicative of a model reverse to the above model. The second phase includes the following steps S31 through S33.

(S31) The HPA modeler 116 applies a model after the update in the first phase to each sample signal acquired from the DPD 112 to generate an ideal feedback signal.

(S32) The training DPD 121 applies a compensation coefficient (which is the same as that currently used by the DPD 112) currently held by the training DPD 121 to the ideal feedback signal acquired from the HPA modeler 116 to perform distortion compensation.

(S33) The subtracter 122 acquires a sample signal after distortion compensation from the DPD 112 and acquires the ideal feedback signal after the distortion compensation from the training DPD 121. The subtracter 122 generates an error signal indicative of an error between the acquired sample signal and the acquired ideal feedback signal. The generation of the above ideal feedback signal and error signal are performed (N) times the number of which is equal to that of sample signals used in the second phase. The training DPD 121 uses N error signals and a statistical technique, such as a least-squares method, and updates the compensation coefficient held by the training DPD 121 so as to minimize an overall error.

(S4) The training DPD 121 copies a compensation coefficient to the DPD 112.

(S5) The radio transmitter 100 determines whether or not a training end condition is met. The training end condition is a frequency condition, such as the frequency condition that the learning described in steps S1 through S4 is repeated a determined number of times, a quality condition, such as the quality condition that an error calculated by the subtracter 122 is smaller than or equal to a threshold, or the like. If the training end condition is met, then the DPD training ends. If the training end condition is not met, then step S1 is performed.

Figure 10:
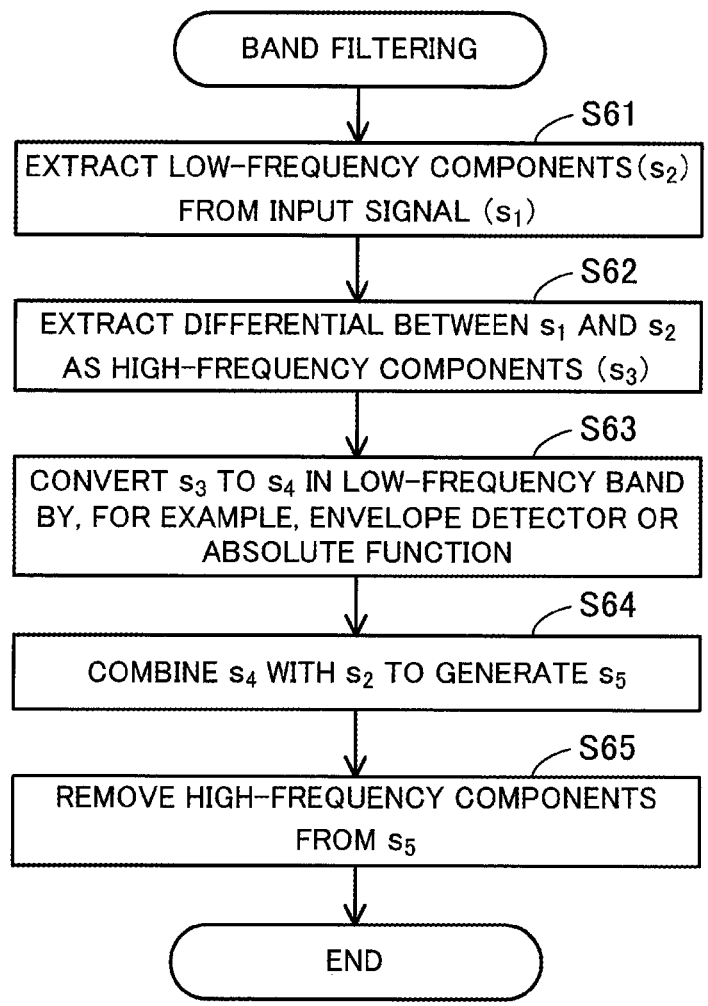
FIG. 10 is a flow chart of an example of a procedure for band filtering.

FIG. 10 is a flow chart of an example of a procedure for band filtering.

This band filtering is performed in the above step S21 by the composite LPF 115 or is performed in the above step S23 by the composite LPF 117. In the following description it is assumed that the band filtering is performed by the composite LPF 115.

(S61) The LPF 131 extracts a signal $s_2$ in a low-frequency band in which the absolute value of a frequency is smaller than or equal to a threshold from a signal $s_1$ (feedback signal) inputted to the composite LPF 115, and removes a signal in a high-frequency band other than the signal $s_2$. The low-frequency band, which is a pass band of the LPF 131, is wider than a desired frequency band used for data communication, and includes low-frequency IMD to be prevented.

(S62) The subtracter 132 subtracts the signal $s_2$ from the signal $s_1$. By doing so, the subtracter 132 extracts a signal $s_3$ in the high-frequency band removed by the LPF 131. The signal $s_3$ in the high-frequency band outputted from the subtracter 132 includes high-frequency IMD to be prevented.

(S63) The envelope detector 133 converts the signal $s_3$ in the high-frequency band to a signal $s_4$ in the low-frequency band. In this case, there is a correlation between a frequency spectrum of the signal $s_3$ and a frequency spectrum of the signal $s_4$. This conversion from the signal $s_3$ in the high-frequency band to the signal $s_4$ in the low-frequency band is nonlinear conversion. The composite LPF 115 may include a nonlinear converter of another type, such as an absolute function, in place of the envelope detector 133.

(S64) The adder 134 combines the signal $s_4$ in the low-frequency band converted from the signal $s_3$ with the signal $s_2$ extracted by the LPF 131 to generate a signal $s_5$ (adds a complex number indicative of the signal $s_2$ and a complex number indicative of the signal $s_4$, for example). By doing so, the characteristics of the high-frequency IMD removed by the LPF 131 are reflected in the signal $s_5$ which passes through the composite LPF 115.

(S65) The LPF 135 removes a signal in a high-frequency band from the signal $s_5$. A pass band of the LPF 135 may be the same as that of the LPF 131.

Figure 11:
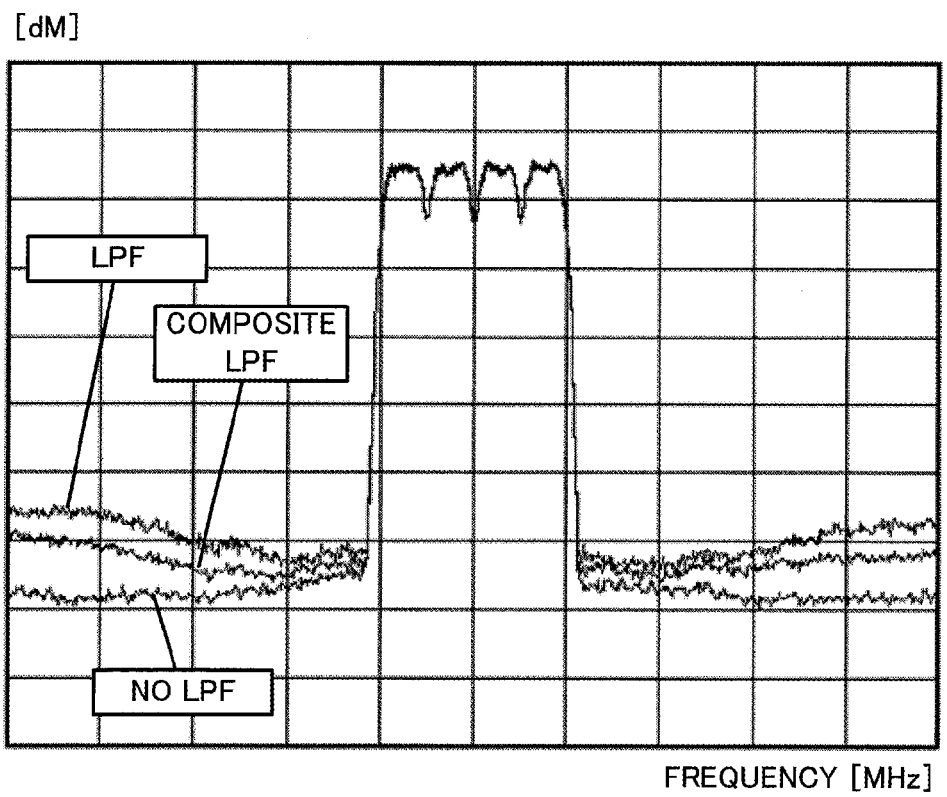
FIG. 11 is a graph indicative of an example of a frequency spectrum.

FIG. 11 is a graph indicative of an example of a frequency spectrum.

This frequency spectrum graph indicates results obtained by simulating an output signal from the power amplifier 113. Simulations are done for three cases, that is to say, for a case where an LPF or a composite LPF is not placed on the feedback path or the forward path (no LPF), a case where simple LPFs are placed on the feedback path and the forward path (LPF), and a case where composite LPFs are placed on the feedback path and the forward path (composite LPF).

Intermodulation distortion which appears in an adjacent frequency band in the case "no LPF" is the smallest of the three cases. However, if a bandwidth of a feedback signal is not limited, the load on a signal processing unit, such as an ADC, becomes heavier or larger signal processing capability is required. In the case "LPF", a bandwidth of a feedback signal can be limited. However, intermodulation distortion which appears in an adjacent frequency band is serious. In the case "composite LPF", on the other hand, a bandwidth of a feedback signal is limited. In addition, intermodulation distortion which appears in an adjacent frequency band is controlled compared with the case "LPF".

Figure 12:
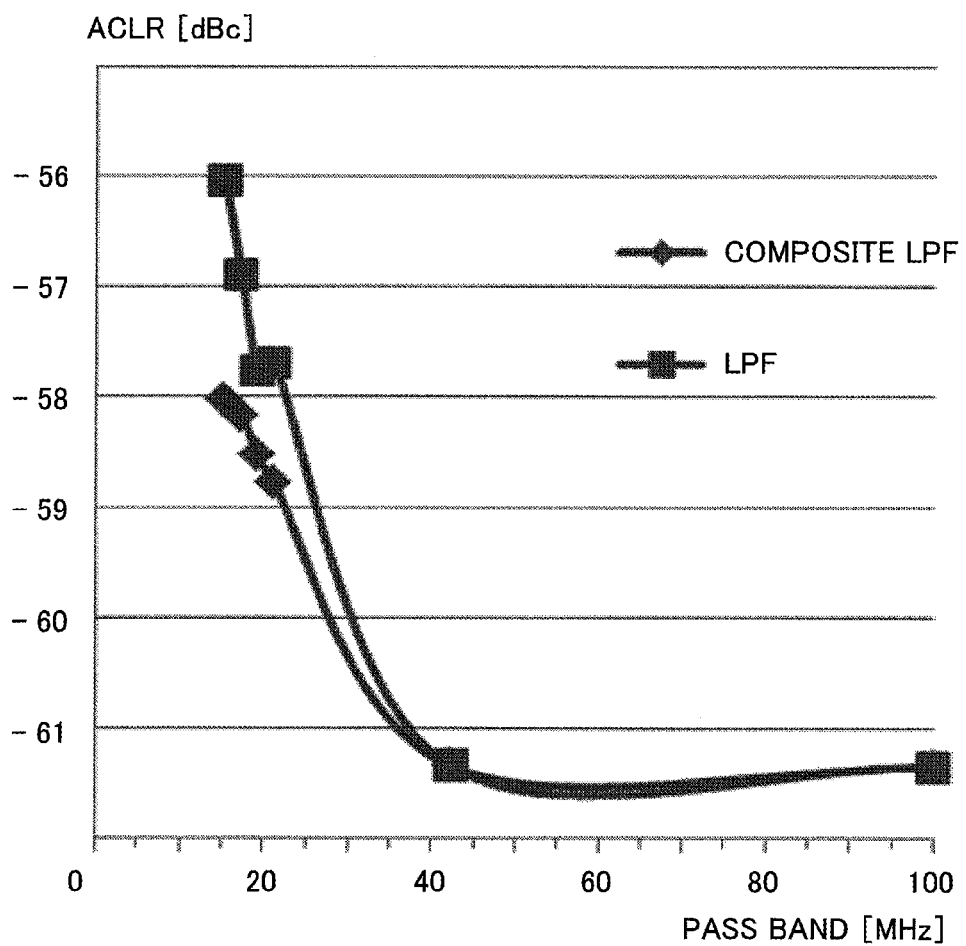
FIG. 12 is a graph indicative of an example of an adjacent channel leakage ratio.

FIG. 12 is a graph indicative of an example of an adjacent channel leakage ratio.

This adjacent channel leakage ratio (ACLR) graph indicates results obtained by simulating an output signal from the power amplifier 113. Simulations are done for two cases, that is to say, for a case where simple LPFs are placed on the feedback path and the forward path (LPF) and a case where composite LPFs are placed on the feedback path and the forward path (composite LPF).

According to the simulation results, there is no difference in ACLR between the cases "LPF" and "composite LPF" if the width of a pass band is wider than or equal to 40 MHz. On the other hand, if the width of a pass band is narrower than 40 MHz, ACLR in the case "composite LPF" is lower than ACLR in the case "LPF". As the width of a pass band becomes narrower, the difference between them grows. For example, if the width of a pass band is limited to about 15 MHz, ACLR in the case "LPF" is about −56 dBc. On the other hand, ACLR in the case "composite LPF" is about −58 dBc.

With the radio transmitter 100 according to the second embodiment a bandwidth of a feedback signal fed back from the power amplifier 113 to the subtracter 118 is limited by the use of an LPF. Accordingly, the load on the radio transmitter 100 is reduced and the costs of various signal processing units, such as an ADC, are reduced. Furthermore, with the radio transmitter 100 low-frequency components which pass through an LPF are distorted according to high-frequency components removed by the LPF for each of a feedback signal and a reference signal. As a result, even if the bandwidths are limited, the HPA modeler 116 can calculate a model of the power amplifier 113 with high-frequency IMD taken into consideration and the accuracy of a compensation coefficient calculated by the training DPD 121 can be improved. Therefore, power leakage to an adjacent channel caused by the power amplifier 113 is reduced.

From one side learning accuracy at the time of a bandwidth of a feedback signal being limited improves.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A distortion compensation apparatus comprising:
    a predistorter which gives an input signal inputted to a power amplifier distortion corresponding to a compensation coefficient;
    a first band limiter which
        limits components in a second frequency band other than a first frequency band of a feedback signal fed back from the power amplifier,
        converts the components in the second frequency band to signals belonging to the first frequency band, and
        combines the signals with components in the first frequency band of the feedback signal; and
    a learner which updates the compensation coefficient on the basis of the feedback signal combined with the signals.

2. The distortion compensation apparatus according to claim 1, further comprising
    a second band limiter which
        limits components in the second frequency band of a reference signal corresponding to the feedback signal and
        distorts components in the first frequency band of the reference signal according to the limited components in the second frequency band,
    wherein the learner updates the compensation coefficient on the basis of the feedback signal and the distorted reference signal.

3. The distortion compensation apparatus according to claim 1, wherein the first band limiter includes:
    a filter which
        allows the components in the first frequency band to pass and
        limits a pass of the components in the second frequency band; and
    a converter which converts the components in the second frequency band to the signals belonging to the first frequency band.

4. The distortion compensation apparatus according to claim 1, wherein
    the first band limiter extracts, from the feedback signal, the components in the first frequency band and the components in the second frequency band.

5. A distortion compensation method for compensating distortion caused by a power amplifier, by using a predistorter, the method comprising:
    limiting components in a second frequency band other than a first frequency band of a feedback signal fed back from the power amplifier,
    converting the components in the second frequency band to signals belonging to the first frequency band, and
    combining the signals with components in the first frequency band of the feedback signal; and
    updating, on the basis of the feedback signal combined with the signals, a compensation coefficient which corresponds to distortion given by the predistorter to an input signal inputted to the power amplifier.

* * * * *